United States Patent [19]

Hatada et al.

[11] Patent Number: 5,012,969
[45] Date of Patent: May 7, 1991

[54] METHOD OF CONNECTING ELECTRODES

[75] Inventors: Kenzo Hatada, Katano; Hiroaki Fujimoto, Hirakata, both of Japan

[73] Assignee: Matsushita Electric Industrial Co., Ltd., Osaka, Japan

[21] Appl. No.: 525,223

[22] Filed: May 17, 1990

Related U.S. Application Data

[63] Continuation of Ser. No. 285,524, Dec. 16, 1988, abandoned.

[30] Foreign Application Priority Data

Dec. 17, 1987 [JP] Japan .................. 62-319443

[51] Int. Cl.$^5$ ............................................. H05K 3/32
[52] U.S. Cl. ............................ 228/104; 228/180.2
[58] Field of Search ............... 228/179, 180.2, 214, 228/263.12, 199, 123, 103, 104

[56] References Cited

U.S. PATENT DOCUMENTS

| 4,441,248 | 4/1984 | Sherman et al. | 228/104 |
| 4,604,644 | 8/1986 | Beckham et al. | 228/180.2 |
| 4,749,120 | 6/1988 | Hatada | 228/123 |

FOREIGN PATENT DOCUMENTS 140637 11/1981 Japan .................. 228/180.2

OTHER PUBLICATIONS

Patent Abstracts of Japan, vol. 12, No. 174 (E-612)[3021], May 24, 1988; JP-A-62-281360, Dec. 7, 1987, Kawakita, Matsushita Electric Industrial Co., Ltd.
Patent Abstracts of Japan, vol. 10, No. 133 (E-404)[2190], May 17, 1986; JP-A-60-262430, Dec. 25, 1985, Hatada, Matsushita Denki Sangyo K.K.

Primary Examiner—Sam Heinrich
Attorney, Agent, or Firm—Wenderoth, Lind & Ponack

[57] ABSTRACT

A face-down connecting an electrode formed on a semiconductor device surface and an electrode on a circuit substrate using an insulating resin, is arranged such that after positioning the electrode of the circuit substrate and the electrode of the semiconductor device, they are pressed from the side of semiconductor device or circuit substrate, and, in this state, a light-stiffening insulating resin is applied to the side surface of the semiconductor device, and then the light-stiffening insulating resin is stiffened. Since the light-stiffening insulating resin is applied and injected between the semiconductor device and circuit substrate with the electrodes of the semiconductor device and circuit substrate pressed together, the light-stiffening insulating resin intervenes between the two electrodes, and the problems of failure of the electrical contact between the two electrodes or a high electrical connection resistance will be avoided. Besides, since the electrodes of the semiconductor device and circuit substrate are positioned before injecting the resin, it is possible to identify the electrodes more easily than when positioning after applying the resin, so that positioning of a higher precision may be effected in a shorter time as compared with prior art methods.

5 Claims, 1 Drawing Sheet

METHOD OF CONNECTING ELECTRODES

This application is a continuation of now abandoned application Ser. No. 07/285,524, filed on Dec. 16, 1988.

BACKGROUND OF THE INVENTION

This invention relates to a method of connecting electrodes, and more particularly to a method of connecting a semiconductor device which is face down, using an insulating resin.

As a method of connecting a semiconductor which is face down on a circuit substrate, it is known to form a solder bump on the electrode of the semiconductor device, and to join it with the wiring electrode on the circuit substrate. In this method, since the electrode of the semiconductor device and the electrode of the circuit substrate are mechanically and electrically connected by the solder bump, when a thermal or mechanical stress acts on the semiconductor device or circuit substrate, the stress is entirely concentrated on the junction of the solder bump, possibly resulting in the breakage of the junction and the lowering of the device reliability.

To solve these problems, as shown in FIG. 1, an electrode 2 is disposed on a semiconductor device 1, and while positioning a wiring electrode 4 of a circuit substrate 3 with this electrode 2, an insulating resin is inserted between the semiconductor device 1 and circuit substrate 3, and the insulating resin is stiffened while pressing the semiconductor device 1. By making use of the contracting force of the insulating resin at the time of stiffening, the electrode 2 of the semiconductor device 1 is pressed against the wiring electrode 4 of the circuit substrate 2, thereby obtaining an electrical connection (for example, as disclosed in U.S. Pat. No. 4,749,120).

In the conventional method of fabrication shown in FIG. 1, an insulating region was placed between the electrode 2 of the semiconductor device 1 and the electrode 4 of the circuit substrate 3, and they were directly pressed together to stiffen the resin. Accordingly, an electrical connection of the two electrodes will not be obtained unless the intervening resin between the two electrodes 2 and 4 is removed, and therefore, the semiconductor device or the circuit substrate was pressed with a high pressure. As a result, a bending stress was formed on the semiconductor device or circuit substrate, and the connection between the electrodes was partially impaired, and it was difficult to obtain a favorable connection. Besides, when the pressure was high, there was a risk of destroying the semiconductor device, and this was particularly obvious in fragile devices other than silicon, such as GaAs.

Still more, since the insulating resin was applied on the entire surface of the semiconductor device 1, when the semiconductor device or circuit substrate was heated to rise in temperature, the entire insulating resin was expanded, and when this expanding force exceeded the contracting force, the electrode at the pressed part and the wiring electrode were separated from each other, which often caused a defective junction.

SUMMARY OF THE INVENTION

It is hence a primary object of this invention to present a highly reliable method of connecting in which the pressing force is small when connecting is effected and which is free from damage to the semiconductor device, when connecting a semiconductor which is face down by using an insulating resin.

It is another object of this invention to present a method of connecting which can lower the connection resistance between electrodes by effecting connecting without inserting any insulating resin between the electrodes of the semiconductor device and the circuit substrate.

It is still another object of this invention to present a method of connecting which can obtain a highly reliable connection without causing a defective junction between the electrodes due to the thermal expansion of the resin, by minimizing the amount of resin intervening between the semiconductor device and the circuit substrate.

In order to achieve these and other objects, this invention presents a method of connecting electrodes comprising the steps of positioning the electrodes of a semiconductor device and a circuit substrate, pressing the two together to obtain a secure connection, applying and injecting an insulating resin from the peripheral margin of the semiconductor device, stiffening the resin, and relieving the pressure to obtain a secure connection between the electrodes.

According to the method in accordance with the present invention, since the resin is applied and injected after pressing the electrodes of the semiconductor device and circuit substrate together, the above-discussed problems such as intervening resin between the electrodes and the thermal expansion of the resin will be solved.

DETAILED DESCRIPTION OF THE INVENTION

Figure 2A:
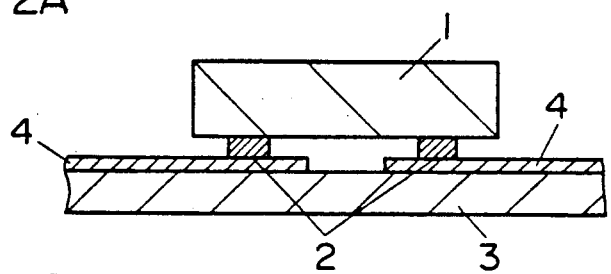
FIGS. 2A-2D is a process sectional views showing the connecting steps of one of the embodiments of this invention.
Figure 2B:
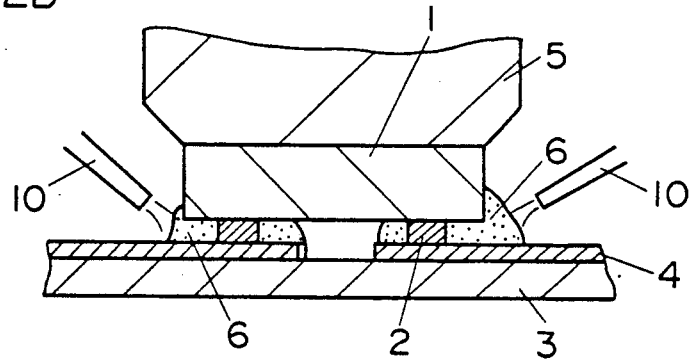
Figure 2C:
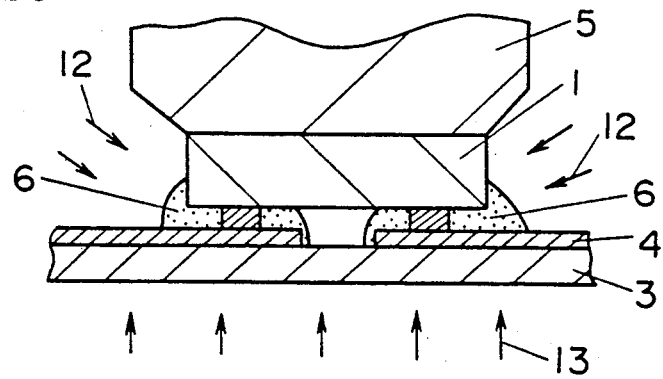
Figure 2D:
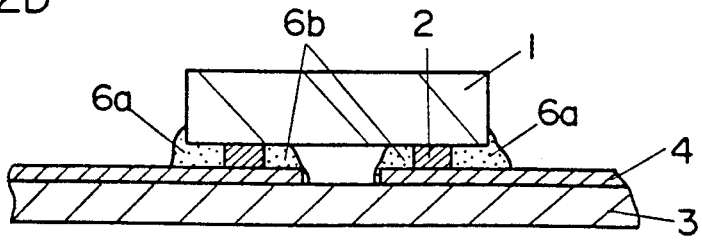

Referring now to FIGS. 2A-2D, an embodiment of the invention is described below. First, an electrode 2 of a semiconductor device 1 such as semiconductor integrated circuit device and an electrode 4 of a circuit substrate 3 are positioned (FIG. 2A), and with the electrodes 2 and 4 contacting each other by applying a pressure between them by means of a pressure tool 5, a light-stiffening insulating resin 6 is injected from the side of the semiconductor device, at least in the gap between the semiconductor device 1 and circuit substrate 3. Actually, along the peripheral margin of the semiconductor device 1, the resin is applied by using a tool 10 such as dispenser (FIG. 2B). Afterwards a light having a wavelength for stiffening the light-stiffening insulating resin 6 (for example about 10 to 30 seconds at 40 mW/cm$^2$) is emitted. For example, in the case of an ultraviolet ray stiffening type resin, ultraviolet rays 12, 13 are emitted from the side of the circuit substrate or from the side of semiconductor device to stiffen the light-stiffening resin 6 (FIG. 2C). Immediately before this light stiffening, it may be also possible to form a further pressurized state. For example, when injecting the resin 6, a pressure of 5 g is applied per electrode, and a pressure of 10 to 70 g is applied when irradiating. After stiffening, this pressure is removed (FIG. 2D). As a result, the electrodes 2 and 4 are electrically connected to each other, and the semiconductor device 1 and circuit substrate 3 are mutually adhered and fixed by the resin 6 at the same time. The electrodes 2 of the semiconductor device maybe gold bumps of, for example, 5 to 20 μm. These bumps may also be formed on the electrode 4 of the circuit substrate.

The light-stiffening resin 6 after stiffening is, as shown in FIG. 2D, at least present in the peripheral area 6a of the semiconductor device 1, and the adjacent part 6b of the electrodes 2 and 4.

As the light-stiffening resin 6, acrylic or epoxy resins stiffened by light only may be used, or resins stiffened by both light and heat may be used. For example, when the circuit substrate is opaque, light is emitted from the rear side of the semiconductor device when the device is in a pressurized state to stiffen the peripheral resin of the semiconductor device, and the resin not illuminated with the light in the vicinity of the electrode may be stiffened at ordinary temperature or by heating.

The results of practical experiments are described below.

The sample was a semiconductor device 1 having 3000 Au electrodes 2 formed on a 7 mm square Si chip at intervals of 100 μm. The height of the Au electrodes 2 was 5 μm, and the circuit substrate 3 was a glass plate, and the wiring electrode 4 was composed of Cr-Au. The test was a thermal impact test which was most susceptible to thermal stress, which was conducted at conditions of $-55°$ C./$+150°$ C.

Figure 1:
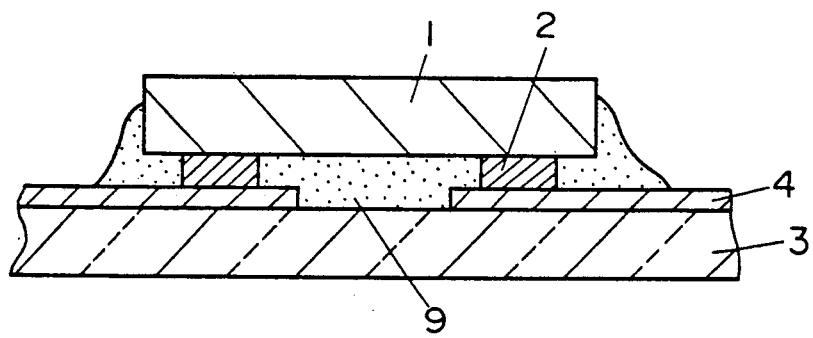
FIG. 1 is a sectional view of a semiconductor device connected by means of an insulating resin by a prior art method.

As a result, in a device formed by the conventional method, as shown in FIG. 1, a junction failure occurred in 520 cycles, while in the method of this invention (FIG. 2D) there was no failure even after 2500 cycles.

It is hence known that the composition of this invention is very effective against thermal stress.

Besides, the contact resistance in the initial connecting point is 4 to 10 mohms in the prior art at the contact area between electrodes of 100 μm$^2$, whereas it is 0.2 to 0.6 ohm in this invention, being more than one order of magnitude smaller. Furthermore, as a result of connecting 1200 LSI chips, the LSI chip breakage rate when connecting, which was 0.35% in the prior art method, was almost 0% in the method in accordance with this invention.

It is moreover evident that this invention may be applied not only to the connection of semiconductor devices but also to the connection of two circuit substrates having electrodes.

This invention brings about, among others, the following benefits:

1. According to the method of this invention, since the insulating resin is applied and injected in a pressurized state, the resin does not intervene between the electrodes of the semiconductor and circuit substrate, so that the contact resistance between the electrodes may be dramatically decreased.

2. Besides, since the resin is applied in the pressurized state, the required pressure is about ⅓ to ½ that of the prior art. Therefore, since the pressure applied to the semiconductor device is small, the semiconductor will not be broken, and this invention may be applied to semiconductor devices made of fragile compounds such as GaAs and InP, aside from Si.

3. In the fabricating method of this invention, since the insulating resin is present only on the periphery of the semiconductor device and in the vicinity of electrodes, the force to expand the resin is small, and the force to pull apart the joined electrodes is small, so that a high reliability may be realized.

4. Since the resin is injected after pressing the electrodes together, the characteristics of the semiconductor device may be measured in the pressurized state, and the semiconductor device may be readily replaced if defective. Also because resin is not deposited on the circuit substrate, the process requirement replacement is extremely short.

5. The injected resin is present on the periphery of the semiconductor device and in the vicinity of the electrodes, and therefore, when the circuit substrate is opaque, when light is emitted from the back side of the semiconductor device, the entire resin can be stiffened by making use of the light turning around from the back.

What is claimed is:
1. A method of connecting electrodes comprising:
   a first step of positioning an electrode formed on a first substrate and an electrode formed on a second substrate, at least one of the first and second substrates including an electrical component;
   a step of pressing both of the electrodes together;
   a step of testing the electrical component to determine if it has predetermined characteristics and if so:
   a step of then injecting an insulating resin from the side of the first substrate so as to fill an area surrounding an interface between the two electrodes;
   a step of stiffening the insulating resin while continuing to press both of the electrodes together; and
   a step of relieving of pressure after the resin is stiffened, whereby the electrodes are electrically connected together and the first and second substrates are affixed together;
   and replacing the substrate including an electrical component if the step of testing the electrical component determines that the electrical component does not have the predetermined characteristics and then repeating the method from the first step.

2. A method of connecting electrodes according to claim 1 wherein the first substrate is a semiconductor chip and the second substrate is a wiring board.

3. A method of connecting electrodes according to claim 1 wherein a metal bump is formed on the electrode of the first substrate or second substrate.

4. A method of connecting electrodes according to claim 1 wherein the insulating resin is stiffened by the application of light or heat.

5. A method of connecting electrodes comprising:
   a first step of positioning a bump electrode of a semiconductor chip and an electrode of a wiring board;
   a first step of pressing the bump electrode of the semiconductor chip and the electrode of the wiring board together so as to form an interface therebetween;
   a step of testing the semiconductor chip to determine if it has predetermined electrical characteristics and if so:
   a step of then injecting an insulating resin from the side of the semiconductor chip so as to fill the area surrounding the interface between the bump electrode and the electrode of the wiring board at least with the insulating resin;
   a step of stiffening the insulating resin while continuing to press both the electrodes together; and
   a step of relieving of pressure after the resin is stiffened, whereby the electrodes are electrically connected together and the semiconductor chip is affixed to the wiring board;
   and replacing the semiconductor chip if the step of testing the semiconductor chip determines that the semiconductor chip does not have the predetermined characteristics and then repeating the method from the first step.

* * * * *